United States Patent
Cooper et al.

(10) Patent No.: US 10,428,271 B2
(45) Date of Patent: Oct. 1, 2019

(54) COMPOSITIONS AND METHODS FOR SELECTIVELY ETCHING TITANIUM NITRIDE

(71) Applicant: Entegris, Inc., Billerica, MA (US)

(72) Inventors: Emanuel I. Cooper, Scarsdale, NY (US); Li-Min Chen, Zhubei (TW); Steven Lippy, Brookfield, CT (US); Chia-Jung Hsu, Hsin-chu (TW); Sheng-hung Tu, Hsin-chu (TW); Chieh Ju Wang, Hsin-chu (TW)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/914,418

(22) PCT Filed: Aug. 28, 2014

(86) PCT No.: PCT/US2014/053172
§ 371 (c)(1),
(2) Date: Feb. 25, 2016

(87) PCT Pub. No.: WO2015/031620
PCT Pub. Date: Mar. 5, 2015

(65) Prior Publication Data
US 2016/0200975 A1    Jul. 14, 2016

Related U.S. Application Data

(60) Provisional application No. 61/872,297, filed on Aug. 30, 2013.

(51) Int. Cl.
*C09K 13/00* (2006.01)
*C09K 13/06* (2006.01)
*H01L 21/311* (2006.01)
*H01L 21/3213* (2006.01)

(52) U.S. Cl.
CPC .............. *C09K 13/00* (2013.01); *C09K 13/06* (2013.01); *H01L 21/31111* (2013.01); *H01L 21/32134* (2013.01)

(58) Field of Classification Search
USPC ........................................................ 252/79.1
See application file for complete search history.

(56) References Cited

U.S. PATENT DOCUMENTS

| | | |
|---|---|---|
| 5,320,709 A | 6/1994 | Bowden |
| 5,702,075 A | 12/1997 | Lehrman |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,395,194 B1 | 5/2002 | Russell et al. |
| 6,409,781 B1 | 6/2002 | Wojtczak et al. |
| 6,447,563 B1 | 9/2002 | Mahulikar |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,627,587 B2 | 9/2003 | Naghshineh et al. |
| 6,698,619 B2 | 3/2004 | Wertenberger |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,849,200 B2 | 2/2005 | Baum et al. |
| 6,875,733 B1 | 4/2005 | Wojtczak |
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,188,644 B2 | 3/2007 | Kelly et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,521,406 B2 | 4/2009 | Hsu |
| 7,534,752 B2 | 5/2009 | Wojtczak et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |

(Continued)

FOREIGN PATENT DOCUMENTS

JP    2011159658 A    8/2011
JP    2012021151 A    2/2012

(Continued)

OTHER PUBLICATIONS

International Search Report/Written Opinion, dated Dec. 5, 2014.

*Primary Examiner* — Roberts Culbert
(74) *Attorney, Agent, or Firm* — Entegris, Inc.

(57) ABSTRACT

Compositions useful for the selective removal of titanium nitride and/or photoresist etch residue materials relative to insulating materials from a microelectronic device having same thereon. The removal compositions contain at least one oxidant, one etchant, and one activator to enhance the etch rate of titanium nitride.

16 Claims, No Drawings

(56) References Cited

U.S. PATENT DOCUMENTS

| | | |
|---|---|---|
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 2001/0004633 A1 | 6/2001 | Naghshineh et al. |
| 2002/0128164 A1* | 9/2002 | Hara ............... C11D 1/62 510/175 |
| 2003/0017962 A1 | 1/2003 | Naghshineh et al. |
| 2003/0148624 A1 | 8/2003 | Ikemoto et al. |
| 2004/0050406 A1* | 3/2004 | Sehgal ............ G03F 7/422 134/26 |
| 2005/0118832 A1 | 6/2005 | Korzenski et al. |
| 2005/0145311 A1 | 7/2005 | Walker et al. |
| 2005/0227482 A1 | 10/2005 | Korzenski et al. |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0166847 A1 | 7/2006 | Walker et al. |
| 2006/0229221 A1 | 10/2006 | Walker et al. |
| 2006/0249482 A1 | 11/2006 | Wrschka et al. |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0271991 A1 | 11/2008 | Korzenski et al. |
| 2009/0032766 A1 | 2/2009 | Rajaratnam et al. |
| 2009/0192065 A1* | 7/2009 | Korzenski ............ C11D 7/08 510/176 |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1 | 5/2010 | Korzenski et al. |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2011/0186086 A1 | 8/2011 | Minsek et al. |
| 2013/0109194 A1 | 5/2013 | Shirota et al. |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2013/0303420 A1 | 11/2013 | Cooper et al. |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2014/0319423 A1 | 10/2014 | Cooper |
| 2015/0027978 A1 | 1/2015 | Barnes et al. |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |

FOREIGN PATENT DOCUMENTS

| | | |
|---|---|---|
| JP | 2012062572 A | 3/2012 |
| JP | 2012186470 A | 9/2012 |
| JP | 2012251026 A | 12/2012 |
| WO | 2006110645 A2 | 10/2006 |
| WO | 2006127885 A1 | 11/2006 |
| WO | 2007027522 A2 | 3/2007 |
| WO | 2008036823 A2 | 3/2008 |
| WO | 2008/141206 A2 | 11/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013138278 A1 | 9/2013 |
| WO | 2015017659 A1 | 2/2015 |
| WO | 2015/031620 A1 | 3/2015 |

\* cited by examiner

COMPOSITIONS AND METHODS FOR SELECTIVELY ETCHING TITANIUM NITRIDE

CROSS-REFERENCE TO RELATED APPLICATIONS

This application is filed under the provisions of 35 U.S.C. §371 and claims the priority of International Patent Application No. PCT/US2014/053172 filed on 28 Aug. 2014 entitled "COMPOSITIONS AND METHODS FOR SELECTIVELY ETCHING TITANIUM NITRIDE" in the name of Emanuel I. Cooper, et al., which claims priority to U.S. Provisional Patent Application No. 61/872,297 filed on 30 Aug. 2013, both of which are hereby incorporated by reference herein in their entirety.

FIELD

The present invention relates to a composition and process for selectively etching titanium nitride and/or photoresist etch residues in the presence of insulator materials (i.e., low-k dielectrics), and more particularly to a composition and process for effectively and efficiently etching titanium nitride and/or photoresist etch residues at an etch rate and selectivity that is higher than that of exposed or underlying low-k dielectric materials.

DESCRIPTION OF THE RELATED ART

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying low-k dielectric material. In other words, the removal chemistry is required to be highly selective to the metal hard mask relative to the low-k dielectric layer.

Accordingly, an object of the present invention to provide improved compositions for the selective removal of hard mask materials relative to low-k dielectric layers that are present, while not compromising the etch rate of the hard mask.

SUMMARY OF THE INVENTION

The present invention relates to a composition and process for selectively etching hard mask layers and/or photoresist etch residues relative to low-k dielectric layers that are present. More specifically, the present invention relates to a composition and process for selectively etching titanium nitride and/or photoresist etch residues relative to low-k dielectric layers.

In one aspect, a composition for selectively removing titanium nitride and/or photoresist etch residue material from the surface of a microelectronic device having same thereon is described, said composition comprising at least one oxidizing agent, at least one activator, and at least one solvent.

In another aspect, a composition for selectively removing titanium nitride and/or photoresist etch residue material from the surface of a microelectronic device having same thereon is described, said composition comprising at least one oxidizing agent, at least one activator, and at least one solvent, wherein the at least one activator comprises a species selected from the group consisting of acetic acid, ammonium acetate, sodium acetate, potassium acetate, tetramethylammonium acetate and other tetraalkylammonium acetates, phosphonium acetate, ammonium butyrate, ammonium trifluoroacetate, amino acids, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, and combinations thereof.

In still another aspect, a method of etching titanium nitride material from a surface of a microelectronic device having same thereon is described, said method comprising contacting the surface with a composition comprising at least one oxidizing agent, at least one activator, and at least one solvent, wherein the composition selectively removes the titanium nitride material from the surface relative to insulating materials.

In still another aspect, a method of etching titanium nitride material from a surface of a microelectronic device having same thereon is described, said method comprising contacting the surface with a composition comprising at least one oxidizing agent, at least one activator, and at least one solvent, wherein the composition selectively removes the titanium nitride material from the surface relative to insulating materials, and wherein the at least one activator comprises a species selected from the group consisting of acetic acid, ammonium acetate, sodium acetate, potassium acetate, tetramethylammonium acetate and other tetraalkylammonium acetates, phosphonium acetate, ammonium butyrate, ammonium trifluoroacetate, amino acids, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, and combinations thereof.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions and processes for selectively etching hard mask layers and/or photoresist etch residues relative to low-k dielectric layers that are present. More specifically, the present invention relates to a composition and process for selectively etching titanium nitride and/or photoresist etch residues relative to low-k dielectric layers. Other materials that may be present on the microelectronic device, should not be substantially removed or corroded by said compositions.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Hardmask capping layer" as used herein corresponds to materials deposited over dielectric material to protect same during the plasma etch step. Hardmask capping layers are traditionally silicon nitrides, silicon oxynitrides, titanium nitride, titanium oxynitride, titanium and other similar compounds.

As used herein, "titanium nitride" and "$TiN_x$" correspond to pure titanium nitride as well as impure titanium nitride including varying stoichiometries, and oxygen content ($Ti-O_xN_y$)

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "amine" species include at least one primary, secondary, and tertiary amines, with the proviso that (i) species including both a carboxylic acid group and an amine group (e.g., amino acids), (ii) surfactants that include amine groups, (iii) species where the amine group is a substituent (e.g., attached to an aryl or heterocyclic moiety), and (iv) amine-N-oxides are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propa- nol, butanol, pentanol, hexanol), and combinations thereof, with the proviso that $R^1$, $R^2$ and $R^3$ cannot all be hydrogen.

As defined herein, "photoresist etch residues" corresponds to any residue comprising photoresist material, or material that is a by-product of photoresist subsequent to an etching or ashing step, as readily understood by the person skilled in the art.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "fluoride" species correspond to species including an ionic fluoride ($F^-$). It is to be appreciated that the fluoride species may be included as a fluoride species or generated in situ.

As used herein, "chloride" species correspond to species including an ionic chloride ($Cl^-$), with the proviso that surfactants that include chloride anions are not considered "chlorides" according to this definition.

As defined herein, a strong base is any base having at least one pKa greater than 11, while a weak base is any base having at least one pKa less than 11.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Embodiments of the present invention include a chemistry for removing hard mask and/or photoresist etch residues. In one embodiment, the removal composition is a wet-etch solution that removes a metal hard mask and/or photoresist etch residues on a dielectric layer and is highly selective to the dielectric layer. In a more specific embodiment, the removal composition is a wet-etch solution that removes a titanium nitride layer and/or photoresist etch residues that is highly selective to low-k dielectric materials.

In a first aspect, a composition for selectively removing titanium nitride and/or photoresist etch residue material from the surface of a microelectronic device having same thereon is described, said composition including at least one oxidizing agent, at least one activator, wherein the activator increases the TiN etch rate. In one embodiment, the composition for removing titanium nitride and/or photoresist etch residue material from the surface of a microelectronic device having same thereon comprises, consists of, or consists essentially of at least one oxidizing agent, at least one activator, and at least one solvent. In another embodiment, the composition for removing titanium nitride and/or photoresist etch residue material from the surface of a microelectronic device having same thereon comprises, consists of, or consists essentially of at least one oxidizing agent, at least one activator, at least one oxidizing agent stabilizer, and at least one solvent. In still another embodiment, the composition for removing titanium nitride and/or photoresist etch residue material from the surface of a microelectronic device having same thereon comprises, consists of, or consists essentially of at least one oxidizing agent, at least one activator, at least one oxidizing agent stabilizer, at least one dielectric passivating agent, and at least one solvent. In another embodiment, the composition for removing titanium nitride and/or photoresist etch residue material from the surface of a microelectronic device having same thereon comprises, consists of, or consists essentially of at least one oxidizing agent, at least one activator, at least one etchant, and at least one solvent. In yet another embodiment, the composition for removing titanium nitride and/or photoresist etch residue material from the surface of a microelectronic device having same thereon comprises, consists of, or consists essentially of at least one oxidizing agent, at least one activator, at least one etchant, at least one oxidizing agent stabilizer, and at least one solvent. In yet another embodiment, the composition for removing titanium nitride and/or photoresist etch residue material from the surface of a microelectronic device having same thereon comprises, consists of, or consists essentially of at least one oxidizing agent, at least one activator, at least one etchant, at least one oxidizing agent stabilizer, water, and at least one organic solvent. In still another embodiment, the composition for removing titanium nitride and/or photoresist etch residue material from the surface of a microelectronic device having same thereon comprises, consists of, or consists essentially of at least one oxidizing agent, at least one activator, at least one etchant, at least one oxidizing agent stabilizer, at least one dielectric passivating agent, and at least one solvent. In each embodiment of the first aspect, at least one silicon-containing compound, at least one surfactant, or any combination thereof, can be added. These compositions are substantially devoid of abrasive materials, chloride sources, metal halides, and combinations thereof. These compositions have pH value in a range from about 5 to about 13, preferably about 6 to about 10 or about 10 to about 13 depending on the nature of the oxidizing agent used.

Etchants are added to increase the etch rate of the titanium nitride. Etchants contemplated include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), strong bases such as tetraalkylammonium hydroxide (NR$_1$R$_2$R$_3$R$_4$OH), where R$_1$, R$_2$, R$_3$, R$_4$ may be the same as or different from one another and is selected from the group consisting of hydrogen, straight-chained or branched C$_1$-C$_6$ alkyl groups (e.g., methyl, ethyl, propyl, butyl, pentyl, hexyl), C$_1$-C$_6$ alkoxy groups (e.g., hydroxyethyl, hydroxypropyl) substituted or unsubstitued aryl groups (e.g., benzyl), weak bases, and combinations thereof. Preferably, the fluoride source comprises tetrafluoroboric acid, hexafluorosilicic acid, H$_2$ZrF$_6$, H$_2$TiF$_6$, HPF$_6$, ammonium fluoride, tetramethylammonium fluoride, ammonium hexafluorosilicate, ammonium hexafluorotitanate, or a combination of ammonium fluoride and tetramethylammonium fluoride. Alternatively, or in addition to fluoride sources, the etchant can comprise a strong base such as tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide (choline hydroxide), (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), Triethylmethylammonium hydroxide, n-hexadecyltrimethylammonium hydroxide 1,1,3,3-tetramethylguanidine (TMG), guanidine carbonate, arginine, and combinations thereof. Weak bases contemplated include, but are not limited to, ammonium hydroxide, monoethanolamine (MEA), diethanolamine (DEA), triethanolamine (TEA), ethylenediamine, cysteine, and combinations thereof. Most preferably, the etchant comprises a strong base such as TMAH, 1,1,3,3-tetramethylguanidine, (2-hydroxyethyl) trimethylammonium hydroxide, benzyltrimethylammonium hydroxide and combinations thereof.

Oxidizing agents are included to oxidize Ti$^{3+}$ in TiN$_x$. Oxidizing agents contemplated herein include, but are not limited to, hydrogen peroxide (H$_2$O$_2$), FeCl$_3$, FeF$_3$, Fe(NO$_3$)$_3$, Sr(NO$_3$)$_2$, CoF$_3$, MnF$_3$, oxone (2KHSO$_5$.KHSO$_4$.K$_2$SO$_4$), periodic acid, iodic acid, vanadium (V) oxide, vanadium (IV,V) oxide, ammonium vanadate, ammonium polyatomic salts (e.g., ammonium peroxomonosulfate, ammonium chlorite (NH$_4$ClO$_2$), ammonium chlorate (NH$_4$ClO$_3$), ammonium iodate (NH$_4$IO$_3$), ammonium nitrate (NH$_4$NO$_3$), ammonium perborate (NH$_4$BO$_3$), ammonium biborate ((NH$_4$)$_2$B$_4$O$_7$), ammonium pentaborate ((NH$_4$)B$_5$O$_8$), or above borate compounds combined with hydrogen peroxide, ammonium perchlorate (NH$_4$ClO$_4$), ammonium periodate (NH$_4$IO$_4$), ammonium persulfate ((NH$_4$)$_2$S$_2$O$_8$), ammonium hypochlorite (NH$_4$ClO)), ammonium tungstate ((NH$_4$)$_{10}$H$_2$(W$_2$O$_7$)), ammonium phosphate dibasic ((NH$_4$)$_2$HPO$_4$) combined with hydrogen peroxide, ammonium phosphate monobasic ((NH$_4$)H$_2$PO$_4$) combined with hydrogen peroxide, phosphoric acid combined with hydrogen peroxide, sodium polyatomic salts (e.g., sodium persulfate (Na$_2$S$_2$O$_8$), sodium hypochlorite (NaClO), sodium perborate), potassium polyatomic salts (e.g., potassium iodate (KIO$_3$), potassium permanganate (KMnO$_4$), potassium persulfate, nitric acid (HNO$_3$), potassium persulfate (K$_2$S$_2$O$_8$), potassium hypochlorite (KClO)), tetramethylammonium or tetraalkylammonium polyatomic salts (e.g., tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$), tetrabutylammonium peroxomonosulfate), peroxomonosulfuric acid, ferric nitrate (Fe(NO$_3$)$_3$), urea hydrogen peroxide ((CO(NH$_2$)$_2$)H$_2$O$_2$), percarboxylic acids such as performic acid (H(CO)OOH), peracetic acid (CH$_3$(CO)OOH), perbutyric acid (CH$_3$CH$_2$(CO)OOH), perbenzoic acid, peroxytrifluoroacetic acid (CF$_3$(CO)OOH), or acetic acid, formic acid, trifluoroacetic acid, benzoic acid or their salts combined with hydrogen peroxide 1,4-benzoquinone, toluquinone, dimethyl-1,4-benzoquinone, chloranil, alloxan, N-methylmorpholine N-oxide, trimethylamine N-oxide, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. Preferably, the oxidizing agent for the composition of the first aspect comprises hydrogen peroxide. Preferably, the oxidizing agent comprises hydrogen peroxide, hydrogen peroxide with strong base (e.g., TMAH, (2-hydroxyethyl) trimethylammonium hydroxide), ammonium iodate (NH$_4$IO$_3$), ammonium periodate (NH$_4$IO$_4$), ammonium phosphate dibasic ((NH$_4$)$_2$HPO$_4$), ammonium phosphate monobasic ((NH$_4$)H$_2$PO$_4$), or above one phosphates combined with hydrogen peroxide, peracetic acid (CH$_3$(CO)OOH), peroxytrifluoroacetic acid (CF$_3$(CO)OOH) performic acid (H(CO)OOH), peracetic acid (CH$_3$(CO)OOH), perbutyric acid (CH$_3$CH$_2$(CO)OOH), peroxytrifluoroacetic acid (CF$_3$(CO)OOH), or acetic acid, formic acid, trifluoroacetic acid combined with hydrogen peroxide. When the oxidizing agent comprises iodate or periodate, an iodine scavenger is preferably added to the removal composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

As introduced hereinabove, the compositions include at least one activator, wherein the activator is thought to increase the etch rate of TiN material. Activators include, but are not limited to acetate salts (e.g., acetic acid, ammonium acetate, sodium acetate, potassium acetate, tetramethylammonium acetate and other tetraalkylammonium acetates, phosphonium acetate), other carboxylate salts (e.g., ammonium butyrate, ammonium trifluoroacetate, amino acids), phosphate salts (e.g., phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate), ammonium phosphonate, tetraalkylammonium phosphonate, sodium phosphonate, potassium phosphonate, phosphonium phosphonate, and combinations thereof. Preferably, the activator comprises at least one phosphate salt such as diammonium monohydrogen phosphate.

Compositions of the first aspect can further include at least one low-k dielectric passivating agent to reduce the chemical attack of the low-k dielectric layers and to protect the wafer from additional oxidation. Preferred low-k passivating agent include, but are not limited to, boric acid, borate salts (e.g., ammonium pentaborate, sodium tetraborate, and ammonium biborate) 3-hydroxy-2-naphthoic acid, malonic acid, iminodiacetic acid, ammonium cations such as alkyltrimethlyammonium chloride or bromide and decyltrimethlyammonium chloride, carnitine, betaine and combinations thereof. When present, the composition includes about 0.01 wt % to about 2 wt % dielectric passivating agent, based on the total weight of the composition. Preferably, less than 2 wt. % of the underlying dielectric material is etched/removed using the compositions described herein, more preferably less than 1 wt. %, most preferably less than 0.5 wt. %, based on the total weight of the underlying low-k material.

Oxidizing agent stabilizers can be added to the aqueous composition, especially when the oxidizing agent is combined with the other components at any time prior to the point of use. Oxidizing agent stabilizers include, but are not limited to, glycine, serine, proline, leucine, alanine, asparagine, aspartic acid, glutamine, valine, and lysine, nitrilotriacetic acid, nitrilotris (methylenephosphonic) acid, iminodiacetic acid, etidronic acid, ethylenediaminetetraacetic acid (EDTA), ethylenedinitrilotetrakis(methylenephosphonic) acid, (1,2-cyclohexylenedinitrilo)tetraacetic acid (CDTA), uric acid, tetraglyme, diethylenetriamine pentaacetic acid, diethylenetriaminepentakis(methylenephosphonic) acid, propylenediamine tetraacetic acid, ethylenediamine disuccinic acid, sulfanilamide, and combinations thereof. Preferably, the oxidizing agent stabilizer comprises EDTA, CDTA, sulfanilamide, or a combination thereof.

Compositions of the first aspect can further include at least one silicon-containing compound to reduce the activity of the etchant source. In one embodiment, the at least one silicon-containing compounds comprises an alkoxysilane. Alkoxysilanes contemplated have the general formula $SiR^1R^2R^3R^4$, wherein the $R^1$, $R^2$, $R^3$ and $R^4$ are the same as or different from one another and are selected from the group consisting of straight-chained $C_1$-$C_6$ alkyl groups (e.g., methyl, ethyl, propyl, butyl, pentyl, hexyl), branched $C_1$-$C_6$ alkyl groups, $C_1$-$C_6$ alkoxy groups (e.g, methoxy, ethoxy, propoxy, butoxy, pentoxy, hexoxy), a phenyl group, and a combination thereof. It should be appreciated by the skilled artisan, that to be characterized as an alkoxysilane, at least one of $R^1$, $R^2$, $R^3$ or $R^4$ must be a $C_1$-$C_6$ alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. Other silicon-containing compounds that can be used instead or in addition to the alkoxysilanes include ammonium hexafluorosilicate, sodium silicate, tetramethyl ammonium silicate (TMAS), and combinations thereof. Preferably, the silicon-containing compound comprises TEOS, TMAS, and sodium silicate. When present, the amount of silicon-containing compound(s) is in the range from about 0.001 wt % to about 2 wt %, based on the total weight of the composition.

To ensure wetting, especially when the pH is low, a surfactant can be added to the aqueous composition, preferably an oxidation resistant, fluorinated anionic surfactant. Anionic surfactants contemplated in the compositions of the present invention include, but are not limited to, fluorosurfactants such as ZONYL® UR and ZONYL® FS-62 (DuPont Canada Inc., Mississauga, Ontario, Canada), and ammonium fluoroalkylsulfonates such as Novec™ 4300 (3M). When the etchant used comprises a fluoride, it is contemplated to use a long-chain tetraalkylammonium fluoride that can be used as a surfactant and the etchant.

The at least one solvent can comprise water, at least one water-miscible organic solvent, or a combination thereof, wherein the at least one water-miscible organic solvent is selected from the group consisting of methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, dimethyl sulfoxide (DMSO), sulfolane, 4-methyl-2-pentanol, and combinations thereof. Preferably, the at least one solvent comprises water, most preferably deionized water. When present, preferably the at least one organic solvent comprises at least one species selected from the group consisting of a glycol ether (e.g., diethylene glycol monomethyl ether, diethylene glycol monoethyl ether, diethylene glycol monobutyl ether), DMSO, sulfolane, and combinations thereof.

In another embodiment, any of the compositions of the invention may further comprise titanium nitride and/or photoresist etch material residue, wherein the residue is suspended and/or dissolved in the aqueous composition.

In an embodiment of the composition of the first aspect, the composition comprises, consists of, or consists essentially of at least one oxidizing agent, at least one etchant, at least one activator, at least one oxidizing agent stabilizer, and at least one solvent, present in the following ranges, based on the total weight of the composition:

| Component | % by weight | more preferred % by weight | most preferred % by weight |
| --- | --- | --- | --- |
| oxidizing agent(s) (after addition) | about 0.001 wt % to about 50 wt % | about 1 wt % to about 30 wt % | about 10 wt % to about 30 wt % |
| etchant(s) | about 0.01 wt % to about 10 wt % | about 0.1 wt % to about 5 wt % | about 0.2 wt % to about 4 wt % |
| activator(s) | about 0.01 to about 10 wt % | about 0.01 to about 6 wt % | about 0.01 to about 3 wt % |
| oxidizing agent stabilizer(s) | about 0.0001 to about 0.5 wt % | about 0.0005 to about 0.2 wt % | about 0.001 to about 0.1 wt % |
| Water | about 39 wt % to about 99 wt % | about 64 wt % to about 99 wt % | about 66 wt % to about 90 wt % |

Preferably, the oxidizing agent comprises hydrogen peroxide and the etchant comprises TMAH.

In another embodiment of the composition of the first aspect, the composition comprises, consists of, or consists essentially of at least one oxidizing agent, at least one etchant, at least one activator, at least one oxidizing agent stabilizer, water, and at least one organic solvent, present in the following ranges, based on the total weight of the composition:

| Component | % by weight | more preferred % by weight | most preferred % by weight |
| --- | --- | --- | --- |
| oxidizing agent(s) (after addition) | about 0.001 wt % to about 50 wt % | about 1 wt % to about 30 wt % | about 5 wt % to about 20 wt % |
| etchant(s) | about 0.01 wt % to about 8 wt % | about 0.05 wt % to about 5 wt % | about 0.1 wt % to about 4 wt % |
| activator(s) | about 0.01 to about 8 wt % | about 0.01 to about 5 wt % | about 0.01 to about 3 wt % |
| oxidizing agent stabilizer(s) | about 0.0001 to about 0.5 wt % | about 0.0005 to about 0.2 wt % | about 0.001 to about 0.2 wt % |
| organic solvent(s) | about 1 wt % to about 30 wt % | about 5 wt % to about 25 wt % | about 5 wt % to about 20 wt % |
| Water | about 3.5 wt % to about 99 wt % | about 35 wt % to about 94 wt % | about 53 wt % to about 90 wt % |

Preferably, the oxidizing agent comprises hydrogen peroxide and the etchant comprises (2-hydroxyethyl) trimethylammonium hydroxide.

In still another embodiment of the composition of the first aspect, the composition comprises, consists of, or consists essentially of at least one oxidizing agent, at least one etchant, at least one activator, at least one oxidizing agent stabilizer, at least one passivating agent, and at least one solvent, present in the following ranges, based on the total weight of the composition:

| Component | % by weight | more preferred % by weight | most preferred % by weight |
| --- | --- | --- | --- |
| oxidizing agent(s) (after addition) | about 0.001 wt % to about 50 wt % | about 1 wt % to about 30 wt % | about 10 wt % to about 30 wt % |
| etchant(s) | about 0.01 wt % to about 10 wt % | about 0.1 wt % to about 5 wt % | about 0.2 wt % to about 4 wt % |
| activator(s) | about 0.01 to about 10 wt % | about 0.01 to about 6 wt % | about 0.01 to about 3 wt % |
| oxidizing agent stabilizer(s) | about 0.0001 to about 0.5 wt % | about 0.0005 to about 0.2 wt % | about 0.001 to about 0.1 wt % |
| passivating agent(s) | about 0.0001 to about 2 wt % | about 0.0005 to about 1.5 wt % | about 0.001 to about 1 wt % |
| solvent(s) | about 1 wt % to about 99 wt % | about 39 wt % to about 97 wt % | about 51 wt % to about 85 wt % |

Preferably, the oxidizing agent comprises hydrogen peroxide and the etchant comprises TMAH.

In a particularly preferred embodiment, the composition comprises, consists of, or consists essentially of a strong base, an activator, CDTA, and water. In another preferred embodiment, the composition comprises, consists of, or consists essentially of TMAH, an activator, CDTA, and water. In still another preferred embodiment, the composition comprises, consists of, or consists essentially of (2-hydroxyethyl) trimethylammonium hydroxide, an activator, CDTA, at least one organic solvent, and water. In yet another preferred embodiment, the composition comprises, consists of, or consists essentially of TMAH, an acetate activator, CDTA, and water. In still another preferred embodiment, the composition comprises, consists of, or consists essentially of TMAH, an acetate activator, CDTA, ammonium biborate, and water. In still another preferred embodiment, the composition comprises, consists of, or consists essentially of (2-hydroxyethyl) trimethylammonium hydroxide, a phosphate activator, CDTA, at least one organic solvent, and water, wherein the pH is in a range from about 6 to about 10. In still another preferred embodiment, the composition comprises, consists of, or consists essentially of a strong base, diammonium hydrogen phosphate, CDTA, at least one organic solvent, and water, wherein the pH is in a range from about 6 to about 10. In each case, the composition is diluted with oxidizing agent, for example, hydrogen peroxide.

It will be appreciated that it is common practice to make concentrated forms of the compositions to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab. In one embodiment of the composition, the diluent is the at least one oxidizing agent and the ratio of diluent to concentrate is in a range from about 30:1 to about 1:1, preferably about 20:1 to about 5:1. For example, if the diluent is 31% hydrogen peroxide, the ratio of diluent to concentrate can be in a range from about 5:1 to about 1:5, preferably about 2:1 to about 1:2.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a second aspect relates to a kit including, in one or more containers, one or more components adapted to form the compositions described herein. The containers of the kit must be suitable for storing and shipping said composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a third aspect, the invention relates to methods of etching titanium nitride material from the surface of the microelectronic device having same thereon using the composition of the first aspect, as described herein. For example, titanium nitride material may be removed without substantially damaging/removing insulator materials that are present on the microelectronic device. Accordingly, in a preferred embodiment, a method of selectively and substantially removing titanium nitride and/or photoresist etch residue materials relative to insulator materials from the surface of the microelectronic device having same thereon is described using the composition of the first aspect, as described herein. In another preferred embodiment, a method of selectively and substantially removing titanium nitride and/or photoresist etch residue materials relative to insulator materials from the surface of the microelectronic device having same thereon is described using the composition of the first aspect described herein.

In etching applications, the composition is applied in any suitable manner to the surface of the microelectronic device having the titanium nitride and/or photoresist etch residue material thereon, e.g., by spraying the composition on the surface of the device, by dipping (in a static or dynamic volume of the composition) of the device including the titanium nitride and/or photoresist etch residue material, by contacting the device with another material, e.g., a pad, or fibrous sorbent applicator element, that has the composition absorbed thereon, by contacting the device including the titanium nitride and/or photoresist etch residue material with a circulating composition, or by any other suitable means, manner or technique, by which the composition is brought into removal contact with the titanium nitride and/or photoresist etch residue material. The application may be in a batch or single wafer apparatus, for dynamic or static cleaning. Advantageously, the compositions described herein, by virtue of their selectivity for titanium nitride and/or photoresist etch residue material relative to other materials that may be present on the microelectronic device structure and exposed to the composition, such as insulating materials (i.e., low-k dielectrics), achieve at least partial removal of the titanium nitride and/or photoresist etch residue material in a highly efficient and highly selective manner.

In use of the compositions of the first aspect for removing titanium nitride and/or photoresist etch residue material from microelectronic device structures having same thereon, the composition typically is contacted with the device structure in a single wafer tool for a sufficient time of from about 0.3 minute to about 30 minutes, preferably about 0.5 minutes to about 3 minutes, at temperature in a range of from about 20° C. to about 100° C., preferably about 30° C. to about 70° C. Such contacting times and temperatures are illustrative, and any other suitable time and temperature conditions may be employed that are efficacious to at least partially remove the titanium nitride and/or photoresist etch residue material from the device structure.

In one embodiment, the composition is heated inline during delivery to the device structure. By heating inline, rather than in the bath itself, the composition life increases.

Following the achievement of the desired etching action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

The compositions of the first aspect preferably selectively etch titanium nitride material relative to insulating (i.e., low-k dielectric) materials. In one embodiment, the etch rate of titanium nitride is high (upwards of 500 Å min$^{-1}$, preferably upwards of about 350 Å min$^{-1}$ at 50° C. and upwards of about 500 Å min$^{-1}$ at 60° C., while the etch rate of low-k dielectric is low (about 0.01 to about 10 Å min$^{-1}$, preferably about 0.01 to about 5 Å min$^{-1}$).

A fourth aspect of the invention relates to the improved microelectronic devices made according to the methods described herein and to products containing such microelectronic devices.

A fifth aspect relates to methods of manufacturing an article comprising a microelectronic device, said method comprising contacting the microelectronic device with a composition for sufficient time to etchingly remove titanium nitride and/or photoresist etch residue material from the surface of the microelectronic device having same thereon, and incorporating said microelectronic device into said article, wherein the composition comprises, consists of or consists essentially of at least one oxidizing agent, at least one etchant, at least one activator, at least one oxidizing agent stabilizer, and at least one solvent. In still another alternative, the composition comprises, consists of, or consists essentially of at least one oxidizing agent, at least one etchant, at least one activator, at least one oxidizing agent stabilizer, at least one dielectric passivating agent, and at least one solvent. The composition may further comprise, consist of or consist essentially of titanium nitride material.

A sixth aspect of the invention relates to an article of manufacture comprising, consisting of or consisting essentially of a microelectronic device substrate, a titanium nitride layer on said substrate, and a composition described herein.

The features and advantages of the invention are more fully shown by the illustrative examples discussed below.

EXAMPLE 1

Concentrates according to the first aspect were prepared as described below in Table 1. Each formulation was diluted 9:1 with 31% $H_2O_2$:concentrate. Coupons of TiN were immersed in each formulation at 55 and 60° C. and the etch rate of determined in triplicate, as shown in Table 2.

TABLE 1

Formulations and etch rates.

| Formulation | 25% TMAH | Acetic acid | Ammonium acetate | CDTA | Ammonium biborate | (NH4)2HPO4 | DI | Total weight |
|---|---|---|---|---|---|---|---|---|
| A | 8-10 | | 0.1-2 | 0.01 to 0.1 | | | Balance | 100.00 |
| B | 8-10 | 0.1-2 | | 0.01 to 0.1 | | | Balance | 100.00 |
| C | 8-10 | | 0.1-2 | 0.01 to 0.1 | 0.1-2 | | Balance | 100.00 |
| D | 8-10 | | 0.1-2 | 0.01 to 0.1 | | 0.1-2 | Balance | 100.00 |
| E | 8-10 | | 0.1-2 | | | | Balance | 100.00 |

TABLE 2

Etch rates of diluted formulations A-E

| Formulation (diluted 9:1 with $H_2O_2$) | TiN etch rate at 55° C./Å min$^{-1}$ | TiN etch rate at 60° C./Å min$^{-1}$ |
|---|---|---|
| A | 440.39 | 1006.85 |
| B | 181.38 | 253.67 |
| C | 478.15 | 673.71 |
| D | 761.29 | >1000 |
| E | 593.83 | 803.79 |

In each case, the film loss of ultra low-k dielectric material was less than 8 Å, when the dielectric constant was k=2.5, and less than 5 Å when the dielectric constant was than k=2.3, both at 60° C., process time 2 min.

EXAMPLE 2

Concentrates according to the first aspect were prepared as described below in Table 3. Each formulation was diluted 1:1 with 31% $H_2O_2$:concentrate. Coupons of TiN and BDIIx were immersed in each formulation at the temperatures indicated in Table 4 and the etch rate of determined in triplicate, as shown in Table 4.

TABLE 3

Formulations

| Formulation | 46.7 wt % choline hydroxide | diammonium hydrogen phosphate | CDTA | DMSO | sulfolane | Diethylene glycol monobutyl ether | Diethylene glycol monoethyl ether | DI water | pH |
|---|---|---|---|---|---|---|---|---|---|
| F | 0.5-2.5 | 0.1-2 | 0.01 to 0.1 | 1-10 | | 1-10 | 1-10 | Balance | 7-8 |
| G | 0.5-2.5 | 0.1-2 | 0.01 to 0.1 | | | 1-10 | 1-10 | Balance | 7-8 |
| H | 0.5-2.5 | 0.1-2 | 0.01 to 0.1 | 1-10 | | 1-10 | 1-10 | Balance | 7-8 |
| I | 0.5-2.5 | 0.1-2 | 0.01 to 0.1 | 1-10 | | 1-10 | 1-10 | Balance | 7-8 |

TABLE 3-continued

Formulations

| Formulation | 46.7 wt % choline hydroxide | diammonium hydrogen phosphate | CDTA | DMSO | sulfolane | Diethylene glycol monobutyl ether | Diethylene glycol monoethyl ether | DI water | pH |
|---|---|---|---|---|---|---|---|---|---|
| J | 0.5-2.5 | 0.1-2 | 0.01 to 0.1 | 1-10 | | 1-10 | 1-10 | Balance | 7-8 |
| K | 0.5-2.5 | 0.1-2 | 0.01 to 0.1 | 1-10 | | 1-10 | 1-10 | Balance | 7-8 |
| L | 0.5-2.5 | 5-10 | 0.01 to 0.1 | 1-10 | | 1-10 | 1-10 | Balance | 7-8 |
| M | 10 | 0.1-2 | 0.01 to 0.1 | 1-10 | | 1-10 | 1-10 | Balance | 9-10 |
| N | 0.5-2.5 | 5-10 | 0.01 to 0.1 | | 1-10 | 1-10 | 1-10 | Balance | 7-8 |
| O | 0.5-2.5 | 0.1-2 | 0.5 | 1-10 | | 1-10 | 1-10 | Balance | 6-7 |
| V | 0.5-2.5 | 5-10 | 0.01 to 0.1 | | 1-10 | 1-10 | 1-10 | Balance | 8-9 |
| P | 0.5-2.5 | 5-10 | 0.01 to 0.1 | | 1-10 | 1-10 | 1-10 | Balance | 7-8 |
| Q | 0.5-2.5 | 5-10 | 0.01 to 0.1 | | 1-10 | 1-10 | 1-10 | Balance | 7-8 |
| R | 0.5-2.5 | 5-10 | 0.01 to 0.1 | | 1-10 | 1-10 | 1-10 | Balance | 7-8 |
| S | 10 | 0.1-2 | 0.01 to 0.1 | | 1-10 | 1-10 | 1-10 | Balance | 9-10 |
| T | 20 | 0.1-2 | 0.01 to 0.1 | | 1-10 | 1-10 | 1-10 | Balance | 9-10 |
| U | 30 | 0.1-2 | 0.01 to 0.1 | | 1-10 | 1-10 | 1-10 | Balance | 9-10 |

TABLE 4

Etch rates of diluted formulations F-U

| Formulation (diluted 1:1 with $H_2O_2$) | TiN etch rate/ Å min$^{-1}$ | BDIIx etch rate/Å min$^{-1}$ (same temp. as TiN ER) |
|---|---|---|
| F | 527 (58° C.) | <0.3 |
| G | 561 (58° C.) | <0.3 |
| H | 545 (58° C.) | <0.3 |
| I | 552 (58° C.) | <0.3 |
| J | 441 (58° C.) | <0.3 |
| K | 542 (63° C.) | <0.3 |
| L | 708 (63° C.) | <0.3 |
| M | 731 (63° C.) | <0.3 |
| N | 709 (63° C.) | <0.3 |
| O | 349 (58° C.) | <0.3 |
| V | 588 (58° C.) | <0.3 |
| P | 608 (60° C.) | <0.3 |
| Q | 600 (60° C.) | <0.3 |
| R | 581 (60° C.) | <0.3 |
| S | 627 (60° C.) | <0.3 |
| T | 584 (60° C.) | <0.3 |
| U | 544 (60° C.) | <0.3 |

It can be seen that choline hydroxide below a certain amount efficiently removed TiN without removing any low-k dielectric material.

\* \* \*

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A composition comprising: at least one oxidizing agent, an etchant, at least one activator present in an amount ranging from about 0.01 percent to about 10 percent by weight, and at least one solvent, wherein the at least one activator comprises a species selected from the group consisting of acetic acid, ammonium acetate, sodium acetate, potassium acetate, phosphonium acetate, ammonium butyrate, ammonium trifluoroacetate, amino acids, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, sodium phosphonate, potassium phosphonate, phosphonium phosphonate, and combinations thereof, wherein when in contact with a surface of a microelectronic device, the composition selectively removes titanium nitride and/or photoresist material from the surface of the microelectronic device without removing low-k dielectric material.

2. The composition of claim 1, wherein the activator comprises ammonium acetate, diammonium monohydrogen phosphate, or combinations thereof.

3. The composition of claim 1, wherein the oxidizing agent comprises at least one species selected from the group consisting of hydrogen peroxide ($H_2O_2$), $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium biborate (($NH_4)_2B_4O_7$), ammonium pentaborate (($NH_4)B_5O_8$), ammonium perchlorate ($NH_4ClO_4$), ammonium periodate ($NH_4IO_4$), ammonium persulfate (($NH_4)_2S_2O_8$), ammonium hypochlorite ($NH_4ClO$)), ammonium tungstate (($NH_4)_{10}H_2(W_2O_7)$), ammonium phosphate dibasic (($NH_4)_2HPO_4$) combined with hydrogen peroxide, ammonium phosphate monobasic (($NH_4)H_2PO_4$) combined with hydrogen peroxide, phosphoric acid combined with hydrogen peroxide, sodium persulfate ($Na_2S_2O_8$), sodium hypochlorite (NaClO), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite (KClO), tetramethylammonium chlorite ((N($CH_3)_4$)$ClO_2$), tetramethylammonium chlorate ((N($CH_3)_4$)$ClO_3$), tetramethylammonium iodate ((N($CH_3)_4$)$IO_3$), tetramethylammonium perborate ((N($CH_3)_4$)$BO_3$), tetramethylammonium perchlorate ((N($CH_3)_4$)$ClO_4$), tetramethylammonium periodate ((N($CH_3)_4$)$IO_4$), tetramethylammonium persulfate (($N(CH_3)_4)_2S_2O_8$), tetrabutylammonium peroxomonosulfate, peroxomonosulfuric acid, ferric nitrate ($Fe(NO_3)_3$), urea hydrogen peroxide (($CO(NH_2)_2)H_2O_2$), performic acid ($H(CO)OOH$), peracetic acid ($CH_3(CO)OOH$), perbutyric acid ($CH_3CH_2(CO)OOH$), perbenzoic acid, peroxytrifluoroacetic acid ($CF_3(CO)OOH$), acetic acid, formic acid, trifluoroacetic acid, benzoic acid, 1, 4-benzoquinone, toluquinone, dimethyl-1,4-benzoquinone, chloranil, alloxan, N-methylmorpholine N-oxide, trimethylamine N-oxide, and combinations thereof.

4. The composition of claim 1, wherein the at least one solvent comprises a species selected from the group consisting of water, methanol, ethanol, isopropanol, butanol, pentanol, hexanol, 2-ethyl-1-hexanol, heptanol, octanol, ethylene glycol, propylene glycol, butylene glycol, hexylene glycol, butylene carbonate, ethylene carbonate, propylene carbonate, choline bicarbonate, dipropylene glycol, dimethylsulfoxide, sulfolane, tetrahydrofurfuryl alcohol (THFA), 1,2-butanediol, 1,4-butanediol, tetramethyl urea, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME),dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, dimethyl sulfoxide, sulfolane, 4-methyl-2-pentanol, and combinations thereof.

5. The composition of claim 1, wherein the at least one solvent comprises water.

6. The composition of claim 1, wherein the at least one solvent comprises water and at least one organic solvent selected from the group consisting of methanol, ethanol, isopropanol, butanol, pentanol, hexanol, 2-ethyl-1-hexanol, heptanol, octanol, ethylene glycol, propylene glycol, butylene glycol, hexylene glycol, butylene carbonate, ethylene carbonate, propylene carbonate, choline bicarbonate, dipropylene glycol, dimethylsulfoxide, sulfolane, tetrahydrofurfuryl alcohol (THFA), 1,2-butanediol, 1,4-butanediol, tetramethyl urea, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME),dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, dimethyl sulfoxide, sulfolane, 4-methyl-2-pentanol, and combinations thereof, preferably at least one of a glycol ether, DMSO, sulfolane, and combinations thereof.

7. The composition of claim 1, wherein the etchant comprises a species selected from the group consisting of $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-$BF_4$), ammonium hexafluorosilicate, ammonium hexafluorotitanate, tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), 1,1,3,3-tetramethylguanidine (TMG), guanidine carbonate, arginine, ammonium hydroxide, monoethanolamine (MEA), diethanolamine (DEA), triethanolamine (TEA), ethylenediamine, cysteine, tetraalkylammonium fluoride ($NR_1R_2R_3R_4F$), where $R_1$, $R_2$, $R_3$, $R_4$ may be the same as or different from one another and is selected from the group consisting of straight-chained or branched $C_1$-$C_6$ alkyl groups, and combinations thereof.

8. The composition of claim 1, wherein the etchant comprises TMAH, (2-hydroxyethyl) trimethylammonium hydroxide, or combinations thereof.

9. The composition of claim 1, further comprising at least one low-k passivating agent selected from the group consisting of boric acid, ammonium pentaborate, sodium tetraborate, ammonium biborate, 3-hydroxy-2-naphthoic acid, malonic acid, iminodiacetic acid, alkyltrimethyammonium chloride, alkyltrimethlyammonium bromide, decyltrimethlyammonium chloride, carnitine, betaine and combinations thereof.

10. The composition of claim 1, further comprising at least one oxidizing agent stabilizer selected from the group consisting of glycine, serine, proline, leucine, alanine, asparagine, aspartic acid, glutamine, valine, and lysine, nitrilotriacetic acid, nitrilotris(methylenephosphonic) acid, iminodiacetic acid, etidronic acid, ethylenediaminetetraacetic acid (EDTA), ethylenedinitrilotetrakis(methylenephosphonic) acid, (1,2-cyclohexylenedinitrilo)tetraacetic acid (CDTA), uric acid, tetraglyme, diethylenetriamine pentaacetic acid, diethylenetriaminepentakis(methylenephosphonic) acid, propylenediamine tetraacetic acid, ethylenediamine disuccinic acid, sulfanilamide, and combinations thereof, preferably (1,2-cyclohexylenedinitrilo)tetraacetic acid.

11. The composition of claim 1, wherein the composition is substantially devoid of abrasive materials, chlorides, metal halides, and combinations thereof.

12. The composition of claim 1, wherein pH of the composition is in a range from about 6 to about 10.

13. The composition of claim 1, wherein pH of the composition is in a range from about 10 to about 13.

14. A method of etching titanium nitride material from a surface of a microelectronic device having same thereon, said method comprising contacting the surface with a composition, said composition comprising at least one oxidizing agent, an etchant, at least one activator present in an amount ranging from about 0.01 percent to about 10 percent by weight, and at least one solvent, wherein the at least one activator comprises a species selected from the group consisting of acetic acid, ammonium acetate, sodium acetate, potassium acetate, tetramethylammonium acetate and other tetraalkylammonium acetates, phosphonium acetate, ammonium butyrate, ammonium trifluoroacetate, amino acids, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, and combinations thereof and wherein the composition selectively removes the titanium nitride titanium nitride and/or photoresist material from the surface of the microelectronic device without removing low-k dielectric material.

15. The method of claim 14, wherein the contacting comprises time in a range from about 0.3 minute to about 30 minutes at temperature in a range of from about 20° C. to about 100° C.

16. The method claim 14, wherein the composition is rinsed from the surface following the desired etching action.

* * * * *